United States Patent
Kawata et al.

(10) Patent No.: US 8,236,416 B2
(45) Date of Patent: Aug. 7, 2012

(54) ADHESIVE SHEET AND PROCESS FOR PRODUCING ELECTRIC COMPONENTS USING THE SHEET

(75) Inventors: Satoru Kawata, Shibukawa (JP); Tomomichi Takatsu, Shibukawa (JP)

(73) Assignee: Denki Kagaku Kogyo Kabushiki Kaisha, Tokyo (JP)

(*) Notice: Subject to any disclaimer, the term of this patent is extended or adjusted under 35 U.S.C. 154(b) by 850 days.

(21) Appl. No.: 12/095,019

(22) PCT Filed: Nov. 29, 2006

(86) PCT No.: PCT/JP2006/323832
§ 371 (c)(1),
(2), (4) Date: May 27, 2008

(87) PCT Pub. No.: WO2007/066553
PCT Pub. Date: Jun. 14, 2007

(65) Prior Publication Data
US 2009/0042035 A1    Feb. 12, 2009

(30) Foreign Application Priority Data
Dec. 7, 2005    (JP) ................... 2005-353225

(51) Int. Cl.
*B32B 7/12* (2006.01)
*B32B 27/34* (2006.01)
*B32B 27/38* (2006.01)

(52) U.S. Cl. ........ 428/343; 426/413; 426/447; 426/523; 426/704

(58) Field of Classification Search ................. 428/343, 428/413, 411.1, 704, 447, 480, 523
See application file for complete search history.

(56) References Cited

U.S. PATENT DOCUMENTS

| 6,562,428 | B1 * | 5/2003 | Ohrui | 428/40.1 |
| 2005/0255325 | A1 * | 11/2005 | Inagaki | 428/447 |
| 2009/0017249 | A1 * | 1/2009 | Suh et al. | 428/41.8 |

FOREIGN PATENT DOCUMENTS

| JP | 6-20442 | 3/1994 |
| JP | 7-26223 | 1/1995 |
| JP | 8-309940 | 11/1996 |
| JP | 9-7976 | 1/1997 |
| JP | 10-315373 | 12/1998 |
| JP | 2000-80135 | 3/2000 |
| JP | 2001-152106 | 6/2001 |

OTHER PUBLICATIONS

Translation of JP 10-315373, Sachiro Morimoto, "Mold Release Film", Dec. 2, 1998.*
PCT International Preliminary Report on Patentability mailed Jun. 19, 2008 re: International Application No. PCT/JP2006/323832 (6 pp).
Search Report issued in International Application No. PCT/JP2006/323832 on Dec. 26, 2006.

* cited by examiner

*Primary Examiner* — Hai Vo
(74) *Attorney, Agent, or Firm* — Stein McEwen, LLP

(57) ABSTRACT

An adhesive sheet and a method for producing electronic components using the sheet are provided.

An adhesive sheet comprising a substrate layer; an antistatic layer formed on one surface of the substrate layer and containing an organic binder, an antistatic agent, an antifriction agent and a curing agent; and an adhesive layer formed on the other surface of the substrate layer; and a method for producing electronic components using the adhesive sheet.

1 Claim, No Drawings

ADHESIVE SHEET AND PROCESS FOR PRODUCING ELECTRIC COMPONENTS USING THE SHEET

CROSS-REFERENCE TO RELATED APPLICATIONS

This application claims the benefit of PCT International Patent Application No. PCT/JP2006/323832, filed Nov. 29, 2006, and Japanese Patent Application No. 2005-353225 filed Dec. 7, 2005, in the Japanese Patent Office, the disclosures of which are incorporated herein by reference.

BACKGROUND OF THE INVENTION

1. Field of the Invention

The present invention relates to an adhesive sheet and a process for producing electronic components using such a sheet.

2. Description of the Related Art

As a method for producing various types of electronic components, a method (dicing) has been known, which is a method of cutting an electronic component group usually called as "a work" such as a semiconductor wafer or a circuit substrate on which circuit patterns are formed, to obtain electronic components (chips) of a predetermined shape. In such a dicing step, a method is widely used, in which a work is fixed to an adhesive sheet, and the work is cut into electronic components by using a dicing blade having an abrasive particles of such as a material a diamond, cleaning and drying the electronic components, and expanding the adhesive sheet to pick up the electronic components (refer to e.g. Patent Documents 1 to 3).

As such an electronic component group, not only an electronic component group such as a semiconductor wafer or a circuit substrate on which circuit patterns are formed, but also a sealed resin package that is sealed with an epoxy resin, such as a ball grid array (BGA), a chip size package (CSP), a stack memory module or a system on module, may be employed.

In recent years, according to wide spread use of small sized electric devices such as PDAs, cell phones or flash memories, electronic components tend to be miniaturized. For this reason, an adhesive sheet for dicing is required, which prevents electrostatic charge due to friction and improves slidability, which can expand sufficiently and uniformly, and which is excellent in abrasion resistance.

Patent Document 1: JP-A-07-026223
Patent Document 2: JP-A-09-007976
Patent Document 3: JP-A-2001-152106

SUMMARY OF THE INVENTION

The present invention provides an adhesive sheet and a method for producing electronic components employing such an adhesive sheet.

The present invention provides an adhesive sheet comprising a substrate layer; an antistatic layer formed on one surface of the substrate layer and containing an organic binder, an antistatic agent, an antifriction agent and a curing agent; and an adhesive agent layer formed on the other surface of the substrate layer. The present invention further provides a method for producing electronic components employing such an adhesive sheet.

Namely, the present invention has the following gists.

(1) An adhesive sheet comprising a substrate layer; an antistatic layer formed on one surface of the substrate layer and containing an organic binder, an antistatic agent, an antifriction agent and a curing agent; and an adhesive layer formed on the other surface of the substrate layer.

(2) The adhesive sheet according to the above (1), wherein the antistatic agent is made of a quaternary ammonium slat monomer.

(3) The adhesive sheet according to the above (1) or (2), wherein the antistatic layer contains from 0.1 to 30 mass parts of the antifriction agent based on 100 mass parts of the organic binder.

(4) The adhesive sheet according to any one of the above (1) to (3), wherein the antistatic layer contains from 0.1 to 30 mass parts of the curing agent based on 100 parts of the organic binder.

(5) The adhesive sheet according to any one of the above (1) to (4), wherein the antifriction agent is a silicone type graft copolymer.

(6) The adhesive sheet according to any one of the above (1) to (5), wherein the curing agent is an epoxy type compound.

(7) The adhesive sheet according to any one of the above (1) to (6), which contains from 0.01 to 30 mass parts of the antistatic agent based on 100 parts of the organic binder.

(8) The adhesive sheet according to any one of the above (1) to (7), wherein the organic binder is a (meta)acrylic acid ester type polymer.

(9) A process for producing electric components, employing the adhesive sheet as defined in any one of the above (1) to (8).

The adhesive sheet of the present invention can suppress electrostatic charge due to friction, improves slidability, which is sufficiently and uniformly expandable, and is excellent in abrasion resistance, and thus, the sheet is suitably employed in the production of electronic components using dicing.

In this specification, (meta)acrylate means a generic name of acrylate and metaacrylate. In the same manner, a compound containing (meta) such as (meta)acrylic acid is also a generic name of a compound having "meta" and a compound having no "meta".

In this specification, a monomer unit means a structural unit derivable from a monomer. In this specification, a part and percentage are mass base units unless otherwise specified.

BEST MODE FOR CARRYING OUT THE INVENTION

The adhesive sheet comprises a substrate layer, an adhesive layer formed on one surface of the substrate layer, and an antistatic layer containing an organic binder, an antistatic agent, an antifriction agent and a curing agent and formed on the other surface of the substrate layer.

Antifriction Agent

The antifriction agent is not particularly limited so long as it is a material reducing the friction coefficient between the adhesive sheet and an expanding apparatus. For example, it may be a silicone compound such as a silicone resin or a (modified) silicone oil, a fluororesin, a hexagonal boron nitride, a carbon black or molybdenum disulfide. The antifriction agent may be a mixture of a plurality of these components. Since electronic components are produced in clean rooms, the antifriction agent is preferably a silicone type compound or a fluororesin. Among silicone type compounds, a copolymer (hereinafter referred to as "silicone type graft copolymer") constituted by a silicone type graft compound as a monomer is preferably employed since it has good compatibility with the antistatic layer, and thus, antistatic property and expanding property can be well balanced.

The silicone type graft copolymer may, for example, be a vinyl copolymer produced by polymerizing a monomer that is a silicone molecule chain having an end at which a vinyl group such as a (meta)acryloyl group or a styryl group is formed (hereinafter referred to as "silicone type graft compound monomer"), and a (meta)acryl type monomer or a monomer such as ethylene or styrene having a vinyl group (refer to e.g. JP-A-2000-080135).

A monomer to be used for a silicone type graft copolymer is not particularly limited so long as it is a vinyl compound, and it is preferably a (meta)acryl type monomer.

The (meta)acryl type monomer is not particularly limited, and it may, for example, be an alkyl(meta)acrylate, a hydroxyalkyl(meta)acrylate, a modified hydroxy(meta)acrylate or (meta)acrylic acid, and an alkyl(meta)acrylate is preferably employed.

The alkyl(meta)acrylate may, for example, be methyl (meta)acrylate, ethyl(meta)acrylate, n-propyl(meta)acrylate, n-butyl(meta)acrylate, isobutyl(meta)acrylate, t-butyl(meta) acrylate, 2-ethylhexyl(meta)acrylate, lauryl(meta)acrylate, stearyl(meta)acrylate, isobornyl(meta)acrylate or a hydroxyalkyl(meta)acrylate.

The hydroxyalkyl(meta)acrylate may, for example, be hydroxyethyl(meta)acrylate, hydroxypropyl(meta)acrylate or hydroxybutyl(meta)acrylate.

The modified hydroxy(meta)acrylate may, for example, be an ethylene oxide modified hydroxy(meta)acrylate or a lactone modified hydroxy(meta)acrylate.

The ratio of the silicone type graft compound monomer unit in the silicone type graft copolymer is not particularly limited, but it is preferably such that in 100 mass parts of the silicone type graft copolymer, the content of the silicone type graft compound monomer is preferably from 5 to 80 mass parts, more preferably from 15 to 60 mass parts. If the content of the silicone type graft compound is small, expansion of the adhesive sheet may be insufficient or ununiform, and if the content is too large, the cost may be increased.

The content of the antifriction agent is not particularly limited, but based on 100 mass parts of organic binder, it is preferably from 0.1 to 30 mass parts, more preferably from 5 to 20 mass parts. If the content of antifriction agent is small, expansion of adhesive sheet may become insufficient, and if the content is too large, antistatic effect may decrease or the antistatic layer may be peeled off by wearing.

Curing Agent

The curing agent is a material for curing the antistatic layer to prevent the antistatic layer from being peeled off by wearing. The curing agent is not particularly limited, and it may, for example, be an epoxy type compound, an aziridine type compound, a melamine type compound or an isocyanate type compound. The curing agent may be a mixture of a plurality of these components. The epoxy type compound is preferred since it has good compatibility with the antistatic layer, and the antistatic property and abrasion resistance can be well balanced. The epoxy type compound is suitably employed in combination with a (meta)acrylic acid ester type polymer or an acryl type organic binder.

The epoxy type compound may, for example, be neopentyl glycol diglycidyl ether, polyethylene glycol diglycidyl ether, bisphenol A-diglycidyl ether, bisphenol F-diglycidyl ether, phthalic acid diglycidyl ester, dimer acid diglycidyl ether, triglycidyl isocyanurate, diglycerol triglycidyl ether, sorbitol tetraglycidyl ether, N,N,N',N'-tetraglycidyl m-xylenediamine, 1'3-bis(N,N-diglycidyl aminomethyl)cyclohexane or N,N,N',N'-tetraglycidyl diaminodiphenyl methane.

The content of the curing agent is not particularly limited, but based on 100 mass parts of the organic binder, the content is preferably from 0.1 to 30 mass parts, more preferably from 1 to 20 mass parts. If the content of the curing agent is small, the antistatic layer may be peeled off by wearing, and if the content is too large, the antistatic effect may decrease or expansion of the adhesive sheet may become insufficient.

Antistatic Agent

The antistatic agent is not particularly limited, and it may be a quaternary ammonium salt monomer.

The quaternary ammonium salt monomer may, for example, be a quaternary ammonium salt of dimethylaminoethyl(meta)acrylate, a quaternary ammonium salt of diethylaminoethyl(meta)acrylate, a quaternary ammonium salt of methylethylaminoethyl(meta)acrylate, a quaternary ammonium salt of p-dimethylaminostyrene or a quaternary ammonium salt of p-diethylaminostyrene, and among these, a quaternary ammonium salt of dimethylaminoethyl metacrylate is preferably employed.

The quaternary ammonium salt monomer can be obtained by making an amino compound such as the above dimethylaminoethyl metacrylate react with a compound represented by a general formula RX, and thus producing a quaternary compound.

The general formula RX may, for example, be ethyl chloride, methyl iodide, ethyl iodide, propyl iodide, butyl iodide, a chloride of organic acid, a bromide of organic acid or an iodide of organic acid.

Here, R is an alkyl group having from 1 to 12 carbon atoms, X is a halogen or an organic acid residue. R is preferably an alkyl group having from 1 to 4 carbon atoms. X may, for example, be a halogen such as F, Cl, Br or I, an organic acid residue derivable from e.g. acetic acid, malonic acid, succinic acid, maleic acid, fumaric acid, P-toluene sulfonic acid or trifluoroacetic acid.

Among these, methyl iodide is preferably employed.

The content of the antistatic agent is not particularly limited, but based on 100 mass parts of organic binder, the content is preferably from 0.005 to 50 mass parts, more preferably from 10 to 30 mass parts. If the content is antistatic agent is too small, the antistatic effect may not be exhibited, and if the content is too large, the adhesion between the substrate layer and the antistatic layer decreases, and accordingly, the antistatic layer may be peeled off by wearing or expansion of the adhesive sheet may become insufficient.

Organic Binder

The organic binder is not particularly limited, it may, for example, be a (meta)acrylic acid ester type polymer, an acryl type polymer, a urethane type polymer, a polyester type polymer, an epoxy type polymer, a polyvinyl chloride type polymer, a melanin type polymer, a polyimide type polymer or a silicone type polymer.

A (meta)acrylic acid ester type polymer is a polymer of vinyl compound constituted by a (meta)acrylic acid ester monomer unit. The (meta)acrylic acid ester type polymer may be constituted by a monomer unit derivable from a functional-group-containing monomer, styrene, vinyltoluene, allyl acetate, (meta)acrylonitrile, vinyl acetate, vinyl propionate, vinyl lactate, vinyl versatate, vinyl ethyl ether, vinyl propyl ether or vinyl isobutyl ether.

As the (meta)acrylic acid ester type polymer, a copolymer of a (meta)acrylic acid ester monomer and a functional-group-containing monomer, can be suitably employed.

The functional-group-containing monomer is a monomer having a functional group such as hydroxyl group, carboxyl group, epoxy group, amide group, amino group, methylol group, sulfonic group, sulfamic group or (phosphorous)phosphoric acid ester group.

A (meta)acrylic acid ester type polymer is suitably employed as the organic binder for the reasons that (1) it has good compatibility with the antistatic agent, the antifriction agent and the curing agent, and (2) it can increase adhesiveness between the antistatic layer and the substrate layer.

The (meta)acrylic acid ester monomer may, for example, be butyl(meta)acrylate, 2-butyl(meta)acrylate, t-butyl(meta)acrylate, pentyl(meta)acrylate, octyl(meta)acrylate, 2-ethylhexyl(meta)acrylate, nonyl(meta)acrylate, decyl(meta)acrylate, lauryl(meta)acrylate, methyl(meta)acrylate, ethyl(meta)acrylate, isopropyl(meta)acrylate, tridecyl(meta)acrylate, myristyl(meta)acrylate, cetyl(meta)acrylate, stearyl(meta)acrylate, cyclohexyl(meta)acrylate or benzyl(meta)acrylate. The (meta)acrylic acid ester monomer may be a mixture of a plurality of components.

The monomer having hydroxyl group may, for example, be 2-hydroxyethyl(meta)acrylate, 2-hydroxypropyl(meta)acrylate or 2-hydroxybutyl(meta)acrylate.

The monomer having carboxyl group may, for example, be (meta)acrylic acid, crotonic acid, maleic acid, maleic anhydride, itaconic acid, fumaric acid, acrylamide N-glycolic acid or cinnamic acid.

The monomer having epoxy group may, for example, be ally glycidyl ether or (meta)acrylic acid glycidyl ether.

The monomer having amide group may, for example, be (meta)acrylamide.

The monomer having amino group may, for example, be N,N-dimethylaminoethyl(meta)acrylate.

The monomer having methylol group may, for example, be N-methylolacrylamide. A plurality of types of such functional-group-containing monomers may be used in combination.

For the (meta)acrylic acid ester type polymer, besides the above monomers, for example, styrene, vinyltoluene, allyl acetate, (meta)acrylonitrile, vinyl acetate, vinyl propionate, vinyl lactate, vinyl versatate, vinyl ethyl ether, vinyl propyl ether or vinyl isobutyl ether may be appropriately employed.

In the antistatic layer, any one of additives such as a plasticizer, an antiaging agent, a filler or an inorganic lubricant may be appropriately added. Here, the total amount of the organic binder, the antistatic agent, the antifriction agent and the curing agent contained in the antistatic layer is preferably from 70 to 100 mass %, particularly preferably from 90 to 100 mass %. Further, based on 100 mass parts of the organic binder, the contents of the antistatic agent, the antifriction agent and the curing agent are from 0.05 to 50 mass parts, from 0.05 to 50 mass parts and from 0.05 to 50 mass parts, respectively, particularly preferably from 10 to 30 mass parts, from 0.1 to 30 mass parts and from 10 to 30 mass parts, respectively.

The method for forming the antistatic layer is not particularly limited. For example, a method of directly coating the substrate layer by using a coater such as a gravure coater, a comma coater, a bar coater, a knife coater or a roll coater, or a method of printing by e.g. relief printing, intaglio printing, surface printing, flexographic printing, offset printing or screen printing, may, for example, be mentioned.

The thickness of the antistatic layer formed is preferably from 0.1 to 20 μm after it is dried, more preferably from 0.5 to 5 μm. If the thickness is small, antistatic effect is not exhibited, and if the thickness is too large, further effect is not expected and thus uneconomical.

Substrate Layer

The thickness and the material of the substrate layer is not particularly limited. The material of the substrate layer may, for example, be a rein such as polyvinyl chloride, polyethylene, polypropylene, polyester, ethylene vinyl alcohol, polyurethane, ionomer, polyamide, polyimide or polyethylene terephthalate (PET).

The substrate layer may be melted-mixed product, a copolymer or a multi-layer sheet of a plurality of these resins. The substrate layer may have a plurality of resin layers, an adhesive layer or an anchor coat layer, etc.

The substrate layer may be applied with a treatment such as corona discharge or anchor coating, so that the adhesiveness with the adhesive layer or the antistatic layer is improved.

Adhesive Layer

The adhesive layer is not particularly limited, and it may be made of a rubber type adhesive agent, an acryl type adhesive agent, an urethane type adhesive agent or a silicone type adhesive agent, etc.

In the adhesive agent, any additive such as an adhesiveness-imparting agent, a curing agent, a plasticizer, a photopolymerizable compound, a photoinitiator, a foaming agent, a polymerization inhibitor, an antiaging agent or a filler, may be appropriately added.

For the adhesive agent, a material cured by radiation ray or heating, may be employed. For example, a method of employing an adhesive agent of UV-curable type which is curable by irradiating with UV light being a type of radiation ray and whose adhesiveness is thereby decreased, or a method of employing an adhesive agent of thermosetting type which is curable by heating and whose adhesiveness is thereby decreased, may be mentioned. Such a material is preferred since picking up of electronic components becomes easy by irradiating the adhesive sheet with UV rays or heating the sheet after dicing.

The method for forming the adhesive layer is not particularly limited, and it may, for example, be a method of directly coating the substrate layer by using a coater such as a gravure coater, a comma coater, a bar coater, a knife coater or a roll coater, or a method of printing by e.g. relief printing, intaglio printing, surface printing, flexographic printing, offset printing or screen printing. The thickness of the adhesive layer is not particularly limited, and it is preferably about 1 to 100 μm after it is dried, more preferably from 5 to 80 μm.

The adhesive sheet is usable in a dicing step or a backgrind step being a production step of electronic components. The adhesive sheet is suitably usable for pasting an electronic component group in the dicing step.

After the electronic component group is pasted to the adhesive sheet and subjected to dicing, an expansion step is carried out in which the expansion property of the adhesive sheet can be further improved by heating the adhesive sheet, whereby picking up of the electronic components becomes easy, such being preferred.

EXAMPLES

An adhesive sheet according to Experiment 1-1 was prepared in the following manner.

Materials Used

Organic binder A: a copolymer of methyl methacrylate and n-butyl methacrylate, which is a commercial product.

Organic binder B: a polyester type resin binder (manufactured by The Nippon Synthetic Chemical Industry Co., Ltd., Polyester WR-961).

Antistatic agent: a quaternary ammonium salt of dimethylaminoethyl methacrylate (quaternary ammonium salt type vinyl monomer), which is a commercial product.

Antifriction agent A: a commercial product obtained by polymerizing 30 mass parts of silicone type graft polymer and 70 mass parts of ethyl acrylate; wherein the silicone type graft polymer is obtained by polymerizing 30 mass parts of silicone type oligomer unit having a methacryloyl group formed at the end of a silicone chain, and 70 mass parts of acrylic vinyl unit.

Antifriction agent B: silicone oil (manufactured by Toshiba Silicone Co., Ltd., TSF-451-1M).

Acryl type adhesive agent: a copolymer of 96 mass % of 2-ethylhexyl acrylate and 4 mass % of 2-hydroxyethyl acrylate, which is a commercial product.

Curing agent A: N,N,N',N'-tetraglycidyl m-xylenediamine, which is a commercial product.

Curing agent B: toluene diisocyanate, which is a commercial product.

Substrate: a polyethylene sheet of 100 μm thick, which is a commercial product.

Antistatic Layer

A solution as a mixture of 100 mass parts of organic binder A, 10 mass parts of an antistatic agent, 10 mass parts of antifriction agent A and 10 mass parts of curing agent A, was applied to the substrate by using a gravure coater, to form an antistatic layer so that the thickness became 1 μm when it was dried.

Adhesive Agent

An adhesive agent was prepared by adding 3 mass parts of curing agent A or curing agent B to 100 mass parts of a commercially available acryl type adhesive agent.

Preparation of Adhesive Sheet

An adhesive sheet was prepared by applying an adhesive agent by using a comma coater to a surface of the substrate opposite from a surface on which the antistatic layer was formed, so that the thickness of the adhesive agent became 20 μm when it was dried.

Adhesive sheets other than the adhesive sheet of Experiment 1-1, were prepared in the same manner as that of Experiment 1-1 except for the conditions shown in Tables 1 to 3.

Tables 1 to 3 show also evaluation results of these adhesive sheets.

Evaluation Method

Adhesive sheets of Examples 1 to 10 and Comparative Examples 1 to 3 were evaluated in the following method.

Surface Resistivity of Antistatic Layer

The surface resistivity of antistatic layers of adhesive sheets were measured under the following conditions according to JIS K 6911.

Temperature: 23° C.
Humidity: 50%
Measurement tools: electrometer (manufactured by ADVANTEST CORPORATION, R8340A) and resistivity chamber (manufactured by ADVANTEST CORPORATION, R12704A).

Dynamic Friction Coefficient

The dynamic friction coefficient of the antistatic layer of each adhesive sheet was measured according to JIS K 7125 under the following conditions.

Temperature: 23° C.
Humidity: 50%
Measurement tool: friction meter TR-2 (manufactured by Toyo Seiki Seisaku-Sho, Ltd.)

Gap Between Chips

An adhesive sheet was pasted to a silicon wafer of 5 inches on which a circuit pattern was formed, so that no bubble remained between them, they were left for 10 minutes, and dicing was carried out by using a dicing blade of 35 μm thick to obtain chips of 5 mm square. Then, by using an expanding apparatus (manufactured by HUGLE ELECTRONICS, HS-1800), the wafer and the adhesive sheet were expanded with an expansion amount of 20 mm at an expansion speed of 20 mm/sec. Thereafter, gaps between chips in the machine-moving direction (MD) and the width direction (TD) were measured at 5 points in each of the center portion and the peripheral portion of the adhesive sheet, and the average value was defined as the chip to chip distance. The result was evaluated in the following manner.

⊚: gap between chips is at least 800 μm.
○: gap between chips is at least 500 μm.
X: gap between chips is less than 500 μm.

Uniformity of Expansion

Expansion was carried out in the same manner as the above, and gap between chips was measured in MD direction and TD direction, and a MD/TD ratio of the gaps between chips was calculated. The results were evaluated in the following manner.

⊚: MD/TD<1.2.
○: MD/D<1.4.
X: MD/TD≧1.4.

Peeling Off of Antistatic Layer by Abrasion

An adhesive sheet was fixed to a stainless steel block, and an antistatic layer side of the adhesive sheet was frictioned with a stainless steel plate in 10 shuttles under the following conditions.

Shape of friction surface of the stainless steel block: 5 cm×5 cm square
Load for friction: 100 g/cm$^2$
Friction length: 10 cm
Speed: 10 cm/sec
Average surface roughness (Ra value) of stainless steel block: 0.05 μm The results were evaluated in the following manner.

⊚: no peeling off of antistatic layer occurred.
○: visually observable fine scratch was present in antistatic layer, but there was no practical problem.
X: antistatic layer was peeled off.

Surface Resistivity of Antistatic Layer Side after Abrasion

After the above friction test, the surface resistance of the antistatic layer was measured according to JIS K 6911 under the following conditions.

Temperature: 23° C.
Humidity: 50%
Measurement tools: electrometer (manufactured by ADVANTEST CORPORATION, R8340A) and resistivity chamber (manufactured by ADVANTEST CORPORATION, R12704A).

The results were evaluated in the following manner.

⊚: less than $1.0 \times 10^9$ Ω/□
○: less than $1.0 \times 10^{10}$ Ω/□
X: at least $1.0 \times 10^{10}$ Ω/□.

TABLE 1

|  |  | Experiment No. 1-1 | 1-2 | 1-3 | 1-4 |
|---|---|---|---|---|---|
| Organic binder | [mass part] | A 100 | A 100 | A 100 | A 100 |
| Antistatic agent | [mass part] | 10 | 10 | 10 | — |
| Antifriction agent | [mass part] | A 10 | A 10 | — | A 10 |
| Curing agent | [mass part] | A 10 | — | A 10 | A 10 |
| Surface resistivity of antistatic layer | [Ω/□] | $1.5 \times 10^8$ | $1.0 \times 10^8$ | $1.1 \times 10^8$ | $3.5 \times 10^{15}$ |
| Dynamic friction coefficient |  | 0.18 | 0.13 | 0.68 | 0.15 |
| Gap between chips | [μm] | 855 ◎ | 948 ◎ | 307 X | 892 ◎ |
| Uniformity of expansion (MD/TD) |  | 1.14 ◎ | 1.08 ◎ | 1.50 X | 1.09 ◎ |
| Peeling off of antistatic layer by friction |  | ◎ | X | ○ | ○ |
| Surface resistivity in the antistatic layer side after friction | [Ω/□] | $1.5 \times 10^8$ ◎ | $1.8 \times 10^{15}$ X | $1.1 \times 10^8$ ◎ | $3.5 \times 10^{15}$ X |
| Remarks |  | Ex. | Comp. Ex. | Comp. Ex. | Comp. Ex. |

Note:
Samples having no organic binder were not evaluated since the antistatic agent, the antifriction agent and the curing agent were easily peeled off from the substrate layer.

TABLE 2

|  |  | Experiment No. 2-1 | 2-2 | 2-3 | 2-4 | 2-5 | 2-6 | 2-7 | 2-8 |
|---|---|---|---|---|---|---|---|---|---|
| Organic binder | [mass part] | A 100 | A 100 | A 100 | A 100 | A 100 | A 100 | A 100 | A 100 |
| Antistatic agent | [mass part] | 10 | 10 | 10 | 10 | 10 | 10 | 10 | 10 |
| Antifriction agent | [mass part] | A 10 | A 10 | A 10 | A 10 | A 0.05 | A 0.1 | A 30 | A50 |
| Curing agent | [mass part] | A 0.05 | A 0.1 | A 30 | A 50 | A 10 | A 10 | A 10 | A 10 |
| Surface resistivity of antistatic layer | [Ω/□] | $1.1 \times 10^8$ | $1.3 \times 10^8$ | $6.0 \times 10^8$ | $2.4 \times 10^9$ | $1.3 \times 10^8$ | $1.4 \times 10^8$ | $2.7 \times 10^8$ | $3.6 \times 10^9$ |
| Dynamic friction coefficient |  | 0.14 | 0.16 | 0.20 | 0.24 | 0.32 | 0.28 | 0.12 | 0.10 |
| Gap between chips | [μm] | 905 ◎ | 875 ◎ | 811 ◎ | 741 ○ | 531 ○ | 805 ◎ | 963 ◎ | 1207 ◎ |
| Uniformity of expansion (MD/TD) |  | 1.10 ◎ | 1.12 ◎ | 1.18 ◎ | 1.26 ○ | 1.38 ○ | 1.19 ◎ | 1.10 ◎ | 1.04 ◎ |
| Peeling off of antistatic layer by friction |  | ○ | ○ | ◎ | ◎ | ◎ | ◎ | ◎ | ◎ |
| Surface resistivity in the antistatic layer side after friction | [Ω/□] | $3.3 \times 10^9$ ○ | $8.2 \times 10^8$ ◎ | $6.0 \times 10^8$ ◎ | $2.4 \times 10^9$ ○ | $1.3 \times 10^8$ ◎ | $1.4 \times 10^8$ ◎ | $2.7 \times 10^8$ ◎ | $3.6 \times 10^9$ ○ |
| Remarks |  | Ex. | Ex. | Ex. | EX. | Ex. | Ex. | Ex | Ex. |

TABLE 3

| | | \multicolumn{7}{c}{Experiment No.} | | | | | | |
|---|---|---|---|---|---|---|---|---|
| | | 3-1 | 3-2 | 3-3 | 3-4 | 3-5 | 3-6 | 3-7 |
| Organic binder | [mass part] | A 100 | A 100 | A 100 | A 100 | A 100 | A 100 | B 100 |
| Antistatic agent | [mass part] | 0.005 | 0.01 | 30 | 50 | 10 | 10 | 10 |
| Antifriction agent | [mass part] | A 10 | A 10 | A 10 | A 10 | A 10 | B 10 | A 10 |
| Curing agent | [mass part] | A 10 | A 10 | A 10 | A 10 | B 10 | A 10 | A 10 |
| Surface resistivity of antistatic layer | [Ω/□] | $9.2 \times 10^9$ | $9.8 \times 10^8$ | $8.3 \times 10^7$ | $5.2 \times 10^7$ | $4.1 \times 10^9$ | $6.5 \times 10^9$ | $4.8 \times 10^9$ |
| Dynamic friction coefficient | | 0.13 | 0.16 | 0.19 | 0.19 | 0.20 | 0.32 | 0.29 |
| Gap between chips | [μm] | 940 ◎ | 905 ◎ | 827 ◎ | 774 ○ | 758 ○ | 548 ○ | 633 ○ |
| Uniformity of expansion (MD/TD) | | 1.11 ◎ | 1.13 ◎ | 1.17 ◎ | 1.21 ○ | 1.33 ○ | 1.37 ○ | 1.35 ○ |
| Peeling off of antistatic layer by friction | | ◎ | ◎ | ◎ | ◎ | ○ | ◎ | ◎ |
| Surface resistivity in the antistatic layer side after friction | [Ω/□] | $9.2 \times 10^9$ ○ | $9.8 \times 10^8$ ○ | $8.3 \times 10^7$ ◎ | $5.2 \times 10^7$ ◎ | $8.8 \times 10^9$ ○ | $6.5 \times 10^9$ ○ | $4.8 \times 10^9$ ○ |
| Remarks | | Ex. | Ex. | Ex. | EX. | Ex. | Ex. | Ex. |

INDUSTRIAL APPLICABILITY

The adhesive sheet of the present invention has effects that it suppresses electrostatic charge due to friction, it is sufficiently and uniformly expandable, and it is excellent in abrasion resistance. Accordingly, the adhesive sheet is suitable for a production method of electronic components, in which an electronic component group that is a semiconductor wafer or a circuit substrate on which a circuit pattern is formed, is subjected to dicing, and is expanded to retrieve electronic components.

The invention claimed is:

1. An adhesive sheet comprising a substrate layer; an anti-static layer formed on one surface of the substrate layer and an adhesive layer formed on the other surface of the substrate layer, wherein the anti-static layer consists essentially of an organic binder, an antistatic agent, an antifriction agent and a curing agent;

the amounts of the antistatic agent, the antifriction agent and the curing agent are 0.01 to 30 parts by mass, 5 to 20 parts by mass and 1 to 20 parts by mass, respectively, based on 100 parts by mass of the organic binder;

the organic binder is a (meta)acryclic acid ester polymer;

the antistatic agent is a quaternary ammonium salt of dimethylaminoethyl(meta)acrylate, a quaternary ammonium salt of diethylaminoethyl(meta)acrylate, a quaternary ammonium salt of methylethylaminoethyl(meta)acrylate, a quaternary ammonium salt of p-dimethylaminosteyrene or a quaternary ammonium salt of p-diethylaminostyrene;

the antifriction agent is a silicone graft copolymer;

the curing agent is an epoxy compound; and the ratio of silicone graft compound monomer unit in the silicone graft copolymer is from 15 to 60 parts by mass.

\* \* \* \* \*